United States Patent [19]
Rich

[11] Patent Number: 5,884,779
[45] Date of Patent: Mar. 23, 1999

[54] HANGING RACK APPARATUS FOR PRINTED CIRCUIT PANELS

[75] Inventor: Dennis E. Rich, West Jordan, Utah

[73] Assignee: Amtech, Inc., West Jordan, Utah

[21] Appl. No.: 169,019

[22] Filed: Dec. 20, 1993

[51] Int. Cl.[6] .................................................. A47G 19/08
[52] U.S. Cl. ...................... 211/41.17; 361/721; 361/802
[58] Field of Search .............................. 211/41, 45, 89; 361/399, 415, 386

[56] References Cited

U.S. PATENT DOCUMENTS

| | | | |
|---|---|---|---|
| 1,248,732 | 12/1917 | Shore et al. | 211/89 X |
| 2,137,748 | 11/1938 | Best | 211/45 |
| 2,178,113 | 10/1939 | Dailey | 211/45 X |
| 2,590,297 | 3/1952 | Curtis, II | 211/89 X |
| 3,665,370 | 5/1972 | Hartmann. | |
| 3,975,805 | 8/1976 | Spurling et al. | 211/41 X |
| 3,982,807 | 9/1976 | Anhalt et al. | |
| 4,298,904 | 11/1981 | Koenig | 361/386 |
| 4,502,601 | 3/1985 | Husted et al. | 211/41 |
| 4,515,277 | 5/1985 | Leth-Sorenson | 211/45 |
| 4,701,829 | 10/1987 | Bricaud et al. | 361/386 |

*Primary Examiner*—Leslie A. Braun
*Attorney, Agent, or Firm*—H. Gordon Shields

[57] ABSTRACT

Circuit panel rack apparatus includes a hanging rack having a slot with a sloping surface. A roller is movable along the sloping surface. The roller moves downwardly along the sloping surface to hold a circuit panel in the rack, and the roller moves upwardly along the sloping surface to release the panel. The upward movement of the roller along the sloping surface is caused by the upward movement of a stem secured to the roller. The roller is biased downwardly along the sloping surface and against the circuit panel by a compression spring disposed about the stem.

9 Claims, 3 Drawing Sheets

5,884,779

HANGING RACK APPARATUS FOR PRINTED CIRCUIT PANELS

BACKGROUND OF THE INVENTION

1. Field of the Invention

This invention relates to rack apparatus for holding printed circuit panels and, more particularly to hanging rack apparatus for holding printed circuit panels during transit by a clamp which secured the printed circuit panels to the transport rack with the panels hanging downwardly from the transport rack.

2. Description of the Prior Art

Most printed circuit board transport racks of the prior art transport the printed circuit panels with the panels extending upwardly from the rack.

The racks include the holder elements for supporting the panels and the panels are disposed in the rack or on the rack in some fashion.

The apparatus of the present invention transports the printed circuit panels as the panels hang downwardly from the rack. The panels are fastened to the rack through a clamp arrangement in which gravity, or the weight of the circuit panel itself, helps to hold the panel in place.

SUMMARY OF THE INVENTION

The invention described and claimed herein comprises hanging rack apparatus for holding circuit panels during transit. The circuit panels are held in an inverted position. That is, they are held in their position by their top or upper portions, and they hang downwardly from the rack. The circuit panels are held in place by a clamp roller which is rotatively secured to a roller block, and the roller block is in turn disposed within an angularly extending slot in the rack. A stem is secured to the roller block and extends upwardly through the rack. The stem is biased downwardly by a tension spring. The roller block moves in the slot and the slot acts as a cam surface so that a downward force on the circuit panel actually increases the pressure or force holding the circuit panel in place. The circuit panel is released by moving the stem upwardly against the bias of its compression spring. The upward movement of the stem causes the roller block to be cammed upwardly and thus moves the roller away from the circuit panel.

Among the objects of the present invention are the following:

To provide new and useful rack apparatus for transporting circuit panels;

To provide new and useful rack apparatus in which a circuit panel hangs downwardly and is clamped to the rack apparatus at the upper portion of the circuit panels;

To provide new and useful rack apparatus in which a roller clamps a circuit panel to hold the circuit panel in place;

To provide new and useful apparatus for holding a circuit panel in which a roller is disposed against a circuit panel and a roller moves along a sloping surface downwardly to clamp the circuit panel and upwardly to release the circuit panel; and To provide new and useful rack apparatus for holding a circuit panel and the circuit panel is released by moving a roller clamp upwardly and outwardly away from the circuit panel and along a sloping surface.

DESCRIPTION OF THE PREFERRED EMBODIMENT

Figure 1:
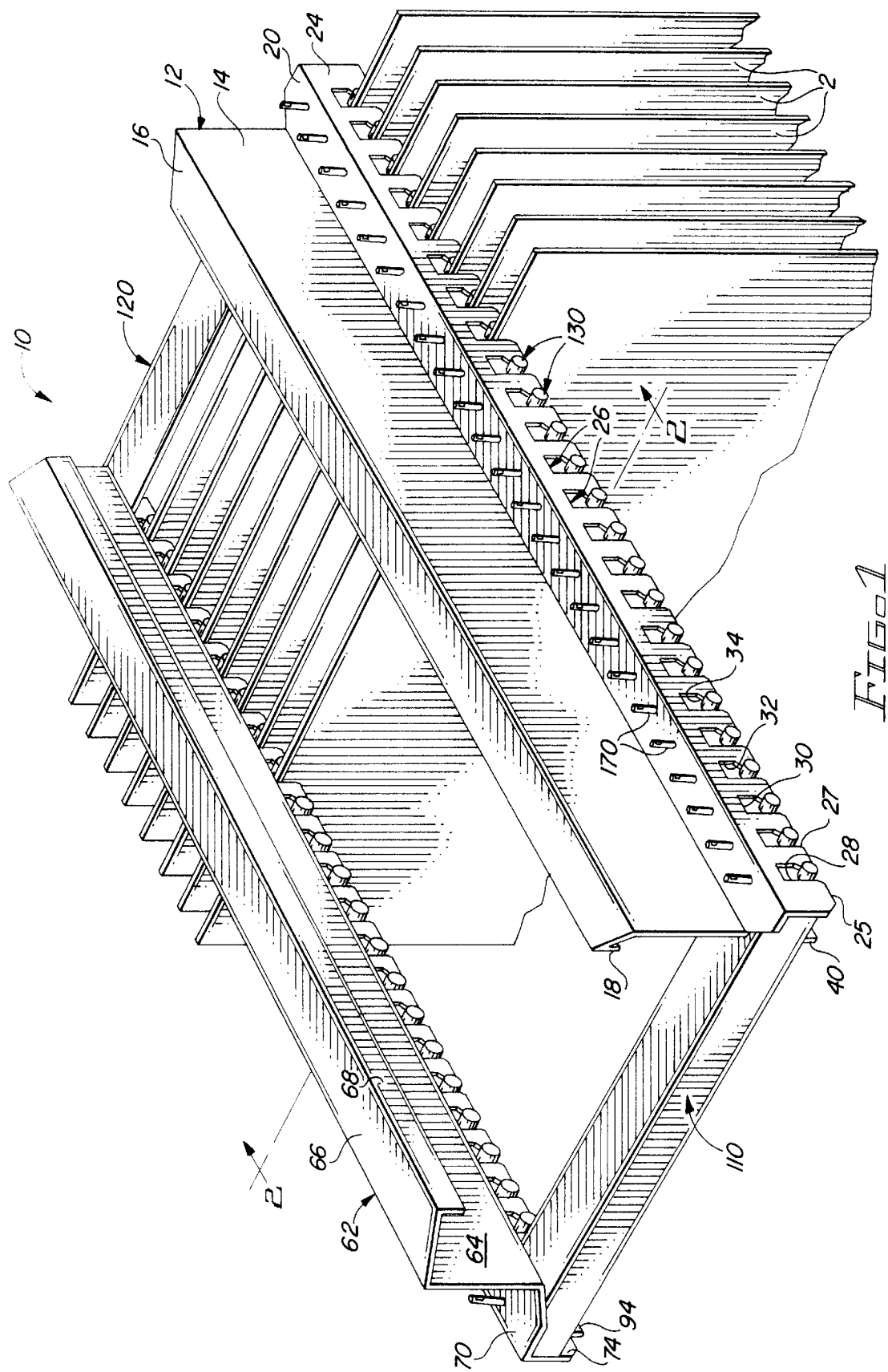
FIG. 1 is a perspective view of the apparatus of the present invention with a plurality of printed circuit panels hanging downwardly therefrom.

FIG. 1 is a perspective view of inverted transport rack apparatus 10 with several printed circuit panels 2 illustratively secured to and hanging downwardly from the rack apparatus 10. The rack apparatus 10 includes two hanger elements or assemblies which are disposed generally parallel to each other. There is a hanger element 12 and a hanger element 62. The two hanger elements or assemblies 12 and 62 are appropriately secured together by a pair of cross members or elements. The cross members or elements include a front cross member 110 and a rear cross member 120.

Figure 2:
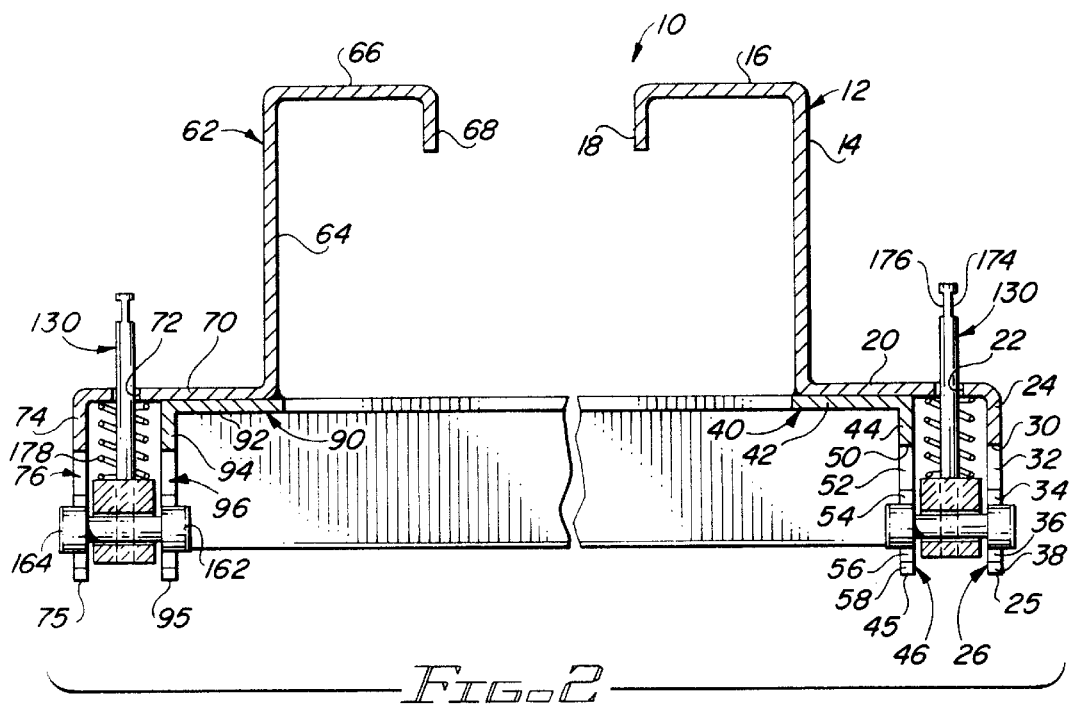
FIG. 2 is a view in partial section taken generally along line 2—2 of FIG. 1.

FIG. 2 is a view in partial section through the rack apparatus 10 taken generally along line 2—2 of FIG. 1. The two hanger elements 12 and 62 are shown in FIG. 2, in partial section and the rear cross member 120 is also shown in FIG. 2. As shown in FIG. 2, the hanger assemblies 12 and 62 are substantially mirror images of each other.

Figure 3A:
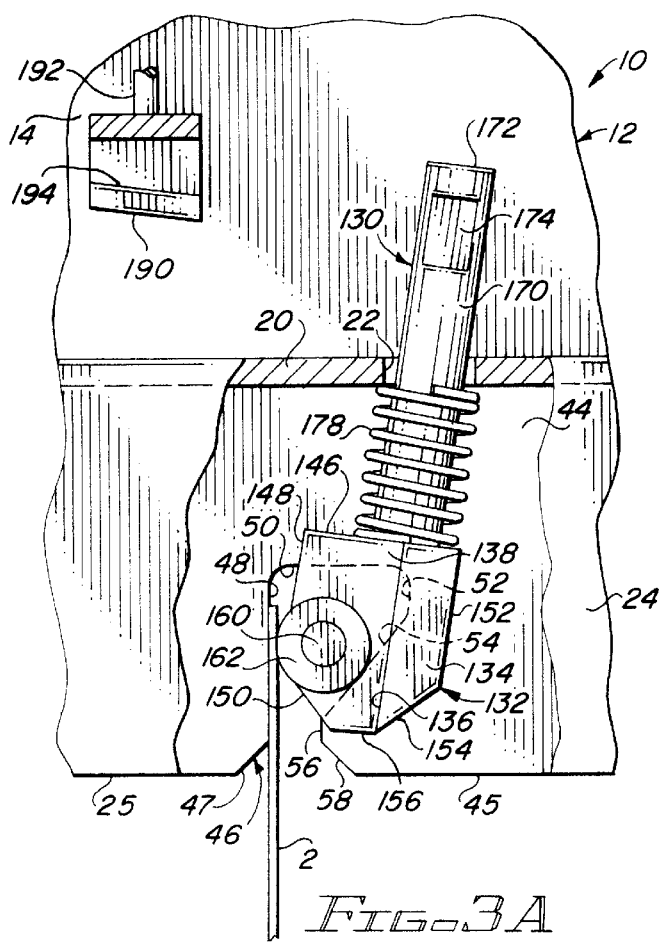
FIG. 3A is an enlarged side view of the apparatus of the present invention in the use environment.

Each hanger or hanger assembly includes a plurality of roller assemblies, and the panels 2 are secured to the hangers or hanger assemblies by the roller assemblies. FIG. 3A is a view in partial section illustrating a panel 2 secured to a roller assembly 130. The roller assembly 130 is shown in the hanger assembly 12.

Figure 3B:
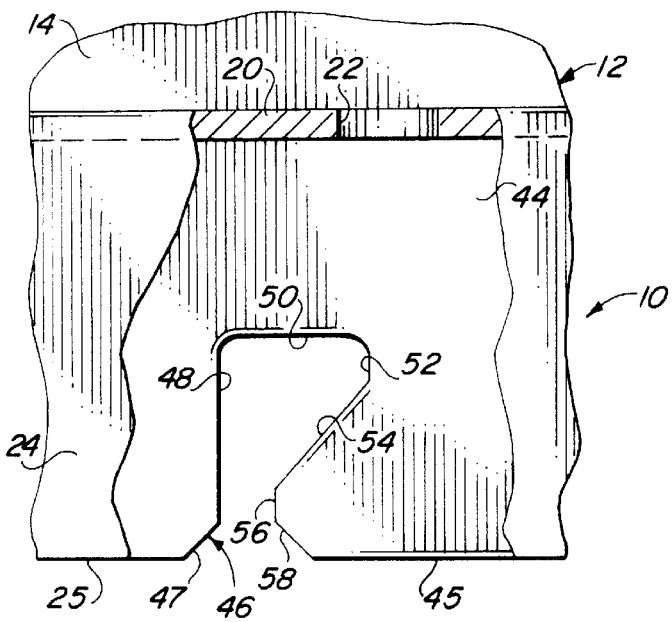
FIG. 3B is an enlarged side view of the apparatus of FIG. 3A with certain elements removed to show structural details.

FIG. 3B is a side view in partial section illustrating the structure shown in FIG. 3A without the panel 2 and the roller assembly 130 to show structural details not clearly shown in FIG. 3A.

Figure 4:
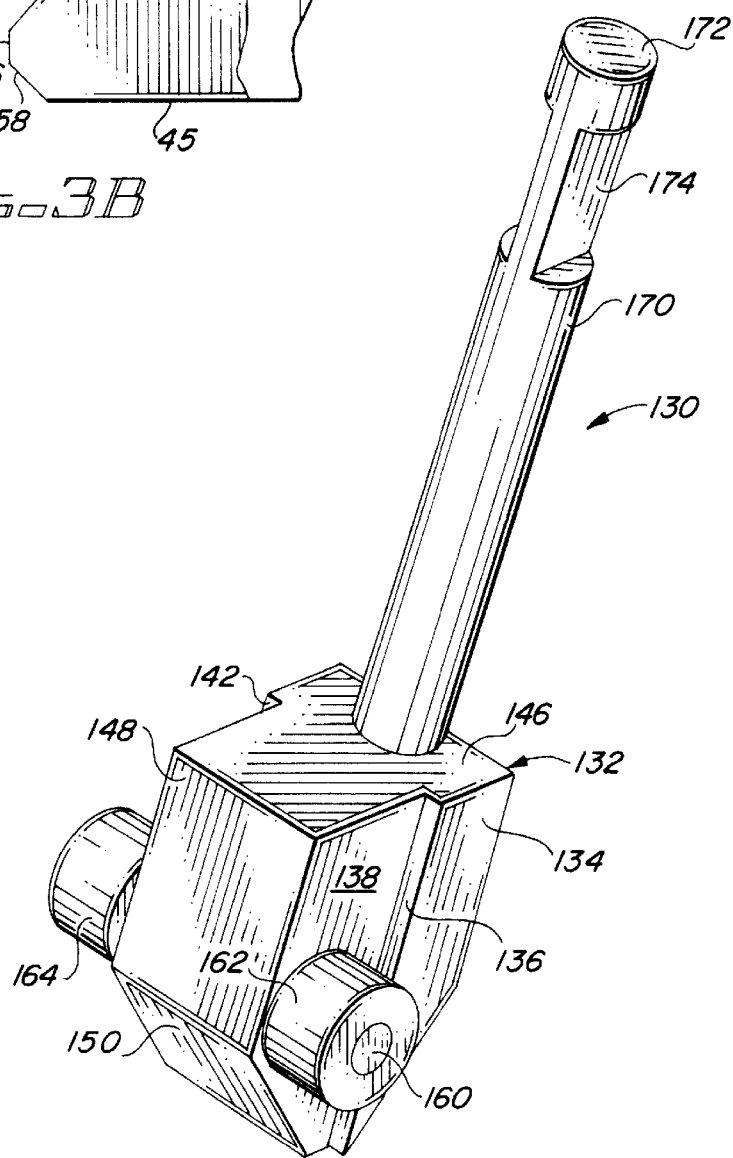
FIG. 4 is a perspective view of a portion of the apparatus of the present invention.

FIG. 4 is a perspective view of a roller assembly 130, illustrating the construction and orientation, or relative relationship, of the various elements of the roller assembly.

For the following discussion of the rack apparatus 10, reference will be made to all of the FIGS. 1, 2, 3 and 4. Particular emphasis will be given to a specific figure as appropriate.

The hanger 12 includes a vertical hanger flange 14 which extends upwardly from a horizontal web 20. At the top of the hanger flange 14 there is a generally horizontally extending top hanger flange 16. The hanger flange 16 extends in the opposite direction from the web 20. A flange 18, an inner flange, extends downwardly from the flange 16 remote from the flange 14. The downwardly extending inner flange 18 is generally parallel to the vertical hanger flange 14.

The web 20 extends generally perpendicularly to the flange 14, and is accordingly generally parallel to the top hanger flange 16. The web 20 extends in the opposite direction from the flange 16 in relation to the flange or member 14. Extending through the web 20 are a number of aligned apertures 22. The apertures 22 cooperate with elements of the roller assemblies 130, as will be discussed below. The apertures 22 are longitudinally aligned with each other.

Extending downwardly from the web 20 remote from the flange 14 is an outer arm 24. The outer arm 24 includes a generally flat bottom 25. Extending upwardly from the bottom 25 is a plurality of notches 26. In the arm 24, the notches 26 are best shown in FIGS. 1 and 2.

Each notch 26 extends upwardly into the arm 24 from the bottom 25. Each notch includes several different surfaces which cooperate with the roller assemblies 130 and with parallel notches, shown in both FIGS. 2 and 3, in an arm 44 which is generally parallel to the arm 24.

The arm 44 comprises a vertical portion of an angle bracket 40. The angle bracket 40 includes a horizontal web 42 which is appropriately secured, as by welding, to the vertical flange 14 and the web 20. The horizontal flange or web 42 is disposed against the web 20 and is appropriately secured thereto. The vertical arm 44 is generally parallel to the arm 24. A plurality of notches 46 extend upwardly into the arm 44 from a bottom 45. The bottom 45 of the arm 44 is generally parallel to the bottom 25 of the arm 24. A notch 46 is best shown in FIG. 3. The notches 46 are substantially identical to and are aligned with the notches 26.

The notch 26 includes a front sloping guide surface 27 which extends a short distance upwardly from the bottom 25. From the sloping guide surface 27, there is a front vertical surface 28 which extends upwardly to a top surface 30. The surface 30 is generally parallel to the web 20.

From the rear of the top surface 30, remote from the front vertical surface 28, there is a rear top vertical surface 32 which extends downwardly a relatively short distance. From the bottom of the rear top vertical surface 32, there is a forwardly extending rear sloping surface 34. The sloping surface 34 terminates in a relatively short rear bottom vertical surface 36. The rear bottom vertical surface 36 extends a relatively short distance to a rear sloping guide surface 38. The rear sloping guide surface 38 extends in the opposite direction from the front sloping guide surface 27.

In the arm 44, the notches 46 extend upwardly from the bottom 45. The notches 46 are substantially identical to, and generally parallel with, the notches 26. Each notch 46, as best shown in FIG. 3, includes a front sloping guide surface 47 which extends upwardly from the bottom surface 45.

From the sloping guide surface 47, there is a front vertical surface 48 which extends upwardly to a top surface 50. The surface 50 is generally parallel to the web 20.

From the rear of the top surface 50, remote from the front vertical surface 48, there is a rear top vertical surface 52 which extends downwardly a relatively short distance. From the bottom of the rear top vertical surface 52, there is a forwardly extending rear sloping surface 54. The sloping surface 54 terminates in a relatively short rear bottom vertical surface 56. The rear bottom vertical surface 56 extends a relatively short distance to a rear sloping guide surface 58. The rear sloping guide surface 58 extends in the opposite direction from the front sloping guide surface 47. The guide surfaces 27, 38 and 47, 58 help to guide the panels 2 upwardly into the portions of the notches 26, 46 above the guide surfaces and against the roller assemblies.

For the following description of the roller assembly 130, attention will generally be directed to FIGS. 3 and 4.

The roller assembly 130 includes a block 132 having a pair of generally parallel notched sides. Each side includes two faces separated by a shoulder. A pair of faces 134 and 138 is shown in FIG. 4 separated by a shoulder 136. The faces of the opposite side are separated by a shoulder 142. The front face 138 and its parallel face on the opposite side of the block 132 are spaced apart a lesser distance than the face 134 and its parallel face on the opposite side of the block 132. The face 138 and the shoulder 136 comprise essentially a notch on the one side of the block 132, and there is essentially a parallel notch on the opposite or other side of the block 134. Rollers or roller elements are disposed in the notches, as will be discussed below.

The block 132 also includes a top surface 146, an upper front surface 148, and a lower front sloping surface 150. The sloping surface 150 slopes downwardly and rearwardly to a bottom surface 156. Extending downwardly from the top surface 146 at the rear of the block 132 is an upper rear surface 152. A downwardly and forwardly sloping rear lower sloping surface 154 extends from the bottom of the surface 152 to the bottom surface 156.

The shoulders 136 and 142 extend from the top surface 146 to about the juncture of the bottom surface 156 and the bottom rear sloping surface 154.

A bore extends through the block 132 between the front side surface 138 and its parallel surface on the opposite side of the block. A pin 160 extends through the bore. The pin 160 is substantially longer than the width of the block 132 between its sides, and accordingly the pin 160 extends outwardly from the sides of the block 132.

Two rollers are appropriately secured to the pin 160. A roller 162 is shown disposed adjacent to the side 138, and a roller 164 is shown disposed adjacent to the other side of the block 132. The outer diameter of the rollers 162 and 164 is such that the outer peripheries of the rollers 162 and 164 extend outwardly or beyond the front face 148 of the block 132. This is shown in FIG. 4, and may best be understood by reference to FIG. 3A.

The bore in the block 132 through which the pin 160 extends is of a larger diameter than the pin 160 and accordingly the pin 160 is free to rotate, with its rollers 162 and 164, relative to the block 132.

As best shown in FIG. 2, the width of the block 132 between its sides is less than the distance between the arms 24 and 44 of the hanger 12. However, the rollers 162 and 164 extend outwardly beyond the arms 24 and 44 in the notches 26 and 46, respectively. The rollers 162 and 164 roll or move on the sloping surfaces 34 and 54, respectively. At the front of the notches 26 and 46, the rollers are limited by the front vertical surfaces 28 and 48, respectively, and by a panel 2.

A pin 170 extends upwardly from the top surface 146 of the block 132. The pin 170 is secured to the block 132 in a bore extending into the block 132 from the top surface 146.

The pin 170 includes a top surface 172. A pair of generally parallel slots 174 and 176 extend into the pin 170 on opposite sides of the pin and a relatively short distance downwardly from the top surface 172.

The slots 174 and 176 cooperate with elements (not shown) to lift or move the roller assembly 130 upwardly in the slots 26, 46 to release a panel 2 from the apparatus 10.

When the roller assemblies 130 are secured to the hangers, there is a compression spring 178, best shown in FIG. 3A, disposed about the stem 170 between the top surface 146 of the block 132 and the web 20. The stem 170 extends through the aperture 22 and upwardly from the web 20. The compression spring 178 has a larger diameter than the aperture 22, and it accordingly biases the block 132 downwardly within the notches 26 and 46.

The diameter of the rollers 162 and 164 is greater than the distance between the front vertical surfaces of the notches and the bottom rear vertical surfaces, and accordingly the roller assemblies are disposed within the notches. The rollers 162 and 164 move on the rear sloping surfaces 34 and 54 of the arms 24 and 44, respectively. Again, the compression spring 178 about the stem 170 urges or biases the roller assemblies to their lowest possible position in the notches 26 and 46.

A panel 2 may be inserted into the notches from the bottom surfaces 25 and 45 of the arms 24 and 44, respectively. The sloping guide surfaces 27, 47 and 38, 58 at the front and the rear of the notches respectively, help to insure that the panels 2 are appropriately guided into the notches and against the roller assemblies disposed therein. The upward movement of the panels 2 as they are inserted causes the panels to be secured by the rollers 162 and 164 against the front faces 28 and 48, respectively, of the notches 26 and 46.

To release the panels 2 from the hangers, the stems 170 are moved upwardly in the holes 22 against the bias of the springs 178 by an appropriate movement. The upward movement of the stems 170 causes the rollers 160 and 162 to move upwardly along the sloping surfaces 34 and 54 of the notches 26 and 46, respectively. As the rollers move upwardly along the rearwardly sloping surfaces, the biasing contact of the rollers against the panels 2 is released and the panels 2 may then be removed downwardly from the hangers.

As best shown in FIG. 3, the stems 170 are oriented at an angular orientation to the web 20 other than perpendicular. The stem 170 slopes rearwardly. The rearward slope of the stem 170 helps to insure an easy release of the panels 2 by the movement of the roller assemblies 130 relative to their respective notches and to the respective hangers.

The hanger assembly 62 is substantially identical to the hanger assembly 12, and accordingly need not be discussed in detail. The hanger 62 is substantially a mirror image of the hanger 12, as indicated.

The hanger 62 as shown in FIGS. 1 and 2 includes a vertical hanger flange 64 which is generally parallel to the hanger flange 14 of the hanger 12. There is a top hanger flange 66 which extends substantially perpendicular to the vertical flange 64. An inner flange 68 extends downwardly from the top flange 66 a relatively short distance, but generally parallel to the flange 64.

The hanger 62 also includes a top web 70 which is generally horizontally extending and generally perpendicular to the flange 64. A plurality of apertures 72 extend through the web 70. The apertures 72 are aligned with the apertures 22 in the web 20. An outer arm 74 extends downwardly from the web 70. The arm 74 includes a bottom surface 75. A notch 76 extends upwardly from the bottom surface 75. The notch 76 is substantially identical to the notches 26 and 46 of the hanger 12.

An angle bracket 90 is appropriately secured to the web 70 and the flange 64. The angle bracket 90 includes a top horizontally extending flange 92 and a vertically extending arm 94. The angle bracket 90 is substantially identical to the angle bracket 40, discussed above. The angle bracket 90 is appropriately secured to the web 70, as by welding.

The arm 94 includes a bottom surface 95. A notch 96 extends upwardly into the arm 94 from the bottom surface 95. The notch 96 is substantially identical to the notch 76, and is aligned therewith. As shown in FIG. 2, and as may be understood, the notches 26, 46, and 76, 96 are appropriately aligned with each other to receive a panel 2.

A roller assembly 130 is disposed within each pair of aligned notches 76 and 96.

Each panel 2 is held to the rack apparatus 10 by a pair of roller assemblies 130 disposed in the notches of the parallel hanger assemblies.

For transport purposes, the rack apparatus 10 may be disposed on roller assemblies beneath the top flanges 16 and 66 and between the flanges 14, 18 and 64, 68 of the hangers 12 and 62, respectively. Obviously, the rack apparatus 10 may be as long as desired, or as convenient, and the spacing between the hangers 12 and 62 may be as appropriate, depending on the width or length of the panels 2 to be held and transported by the rack apparatus 10.

A release cam unit 190 is illustrated in FIG. 3A in partial section. The released cam unit 190 includes a stem 192 which is fixed in place. The release cam unit 190 includes a yoke extending downwardly from the stem 192, and within the yoke are two cam surfaces which engage the notches 174 and 176 on the stem 170. As the hanger apparatus 10 moves relative to the release cam unit 190, the stem 170 is cammed upwardly against the bias of the spring 178 to release the panel 2. One cam surface 194 for the notch 176 is shown in FIG. 3A. Another cam surface, a mirror image twin, now shown, extends into the notch 174.

Another release cam unit, not shown, is aligned with the unit 190 for releasing the opposite side of the panel 2, as may be understood from FIGS. 1 and 2.

As the hanger apparatus 10 approaches the release point for each panel 2, the notches 174, 176 approach the release cam 194 and its twin in the unit 190. The notches 174, 176 move on the cam 194 and its twin to move the stem 170 upwardly. The rollers 162, 164 then move upwardly on their respective sloping surfaces 34, 54, as discussed above, to release a board 2.

While the principles of the invention have been made clear in illustrative embodiments, there will be immediately obvious to those skilled in the art many modifications of structure, arrangement, proportions, the elements, materials, and components used in the practice of the invention, and otherwise, which are particularly adapted to specific environments and operative requirements without departing from those principles. The appended claims are intended to cover and embrace any and all such modifications, within the limits only of the true spirit and scope of the invention.

What I claim is:

1. Hanging rack apparatus for holding printed circuit panels comprising in combination:

slot means for receiving a printed circuit panel, including a sloping surface;

roller means movable on the sloping surface for holding the printed circuit panel in the slot means; and a stem secured to the roller means for moving the roller means upwardly on the sloping surface for releasing the printed circuit panel.

2. The apparatus of claim 1 in which the slot means includes a pair of slots spaced apart from each other, and each slot includes a sloping surface.

3. The apparatus of claim 2 in which the roller means includes a pair of rollers disposed in the pair of slots and the rollers are movable on the sloping surfaces.

4. The apparatus of claim 3 in which the roller means further includes a block disposed between the pair of slots, and the pair of rollers is secured to the block.

5. The apparatus of claim 4 in which the stem is secured to the block.

6. The apparatus of claim 1 in which the slot means includes a first vertical surface and a second vertical surface spaced apart from the first vertical surface a first distance, and the sloping surface extends upwardly from the second vertical surface and away from the first vertical surface.

7. The apparatus of claim 6 in which the roller means includes a roller having a diameter greater than the first distance.

8. Hanging rack apparatus for holding a printed circuit panel comprising in combination:

a first arm;

a first plurality of slots in the first arm, each slot of the plurality of slots including
   a first vertical surface,
   a second vertical surface spaced apart from the first vertical surface a first distance, and
   a first sloping surface extending upwardly from the second vertical surface and away from the first vertical surface;

a second arm;

a second plurality of slots in the second arm paired with the first plurality of slots, each slot of the plurality of slots including
   a third vertical surface parallel to the first vertical surface
   a fourth vertical surface parallel to the second vertical surface and spaced apart from the third vertical surface the first distance, and
   a second sloping surface extending upwardly from the fourth vertical surface and away from the third vertical surface and parallel to the first sloping surface;

a web extending between and secured to the first and second arms;

roller means disposed between the first and second arms including
   a block disposed adjacent to each pair of first and second pluralities of slots, and
   a pair of rollers secured to the block, including a first roller movable on the first sloping surface and a second roller movable on the second sloping surface; and a printed circuit panel is disposed in a pair of first and second slots and held therein by the pair of rollers.

9. The apparatus of claim 8 in which the roller means further includes a stem secured to the block and extending through the web and movable for moving the rollers upwardly on the first and second sloping surfaces to release the printed circuit panel.

* * * * *